(12) United States Patent
Vo et al.

(10) Patent No.: US 7,808,117 B2
(45) Date of Patent: Oct. 5, 2010

(54) INTEGRATED CIRCUIT HAVING PADS AND INPUT/OUTPUT (I/O) CELLS

(75) Inventors: Nhat D. Vo, Austin, TX (US); Tu-Anh N. Tran, Austin, TX (US); Burton J. Carpenter, Austin, TX (US); Dae Y. Hong, Austin, TX (US); James W. Miller, Austin, TX (US); Kendall D. Phillips, Driftwood, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 614 days.

(21) Appl. No.: 11/383,653

(22) Filed: May 16, 2006

(65) Prior Publication Data
US 2007/0267755 A1 Nov. 22, 2007

(51) Int. Cl.
*H01L 23/48* (2006.01)
(52) U.S. Cl. .............. 257/786; 257/782; 257/602; 257/700; 257/758; 257/774; 257/775; 257/E21.59; 257/E23.02; 257/E23.037; 257/E23.04; 257/E21.523
(58) Field of Classification Search .............. None
See application file for complete search history.

(56) References Cited

U.S. PATENT DOCUMENTS

| | | |
|---|---|---|
| 5,034,845 A | 7/1991 | Murakami |
| 5,149,674 A | 9/1992 | Freeman, Jr. et al. |
| 5,239,440 A | 8/1993 | Merrill |
| 5,287,241 A | 2/1994 | Puar |
| 5,311,391 A | 5/1994 | Dungan et al. |
| 5,361,185 A | 11/1994 | Yu |
| 5,440,162 A | 8/1995 | Worley et al. |

(Continued)

FOREIGN PATENT DOCUMENTS

EP 0026056 A1 4/1981

(Continued)

OTHER PUBLICATIONS

Horner et al., Implementation of Pad Circuitry for Radially Staggered Bond Pad Arrangements, Hewlett-Packard Journal, Dec. 1996, pp. 1-5.

(Continued)

*Primary Examiner*—Victor A Mandala
*Assistant Examiner*—Fei Fei Yeung Lopez
(74) *Attorney, Agent, or Firm*—Susan C. Hill; Joanna G. Chiu (57) ABSTRACT

A pad (20) is electrically connected to a first I/O cell (14) while also physically overlying active circuitry of a second I/O cell (16). Note that although the pad (20) overlies the second I/O cell (16), the pad (20) is not electrically connected to the I/O cell (16). Such a pattern may be replicated in any desired manner so that the I/O cells (e.g. 300-310) may have a finer pitch than the corresponding pads (320-324 and 330-335). In addition, the size of the pads may be increased (e.g. pad 131 may be bigger than pad 130) while the width "c" of the I/O cells (132-135) does not have to be increased. Such a pattern (e.g. 500) may be arranged so that the area required in one or more dimensions may be minimized.

20 Claims, 8 Drawing Sheets

U.S. PATENT DOCUMENTS

| | | | |
|---|---|---|---|
| 5,506,499 | A | 4/1996 | Puar |
| 5,508,649 | A | 4/1996 | Shay |
| 5,514,892 | A | 5/1996 | Countryman et al. |
| 5,559,659 | A | 9/1996 | Strauss |
| 5,610,790 | A | 3/1997 | Staab et al. |
| 5,654,862 | A | 8/1997 | Worley et al. |
| 5,751,051 | A | 5/1998 | Hayano |
| 5,751,065 | A | 5/1998 | Chittipeddi et al. |
| 5,764,485 | A | 6/1998 | Lebaschi |
| 5,818,114 | A | 10/1998 | Pendse et al. |
| 5,825,600 | A | 10/1998 | Watt |
| 5,907,464 | A | 5/1999 | Maloney et al. |
| 5,923,088 | A | 7/1999 | Shiue et al. |
| 5,946,177 | A | 8/1999 | Miller et al. |
| 5,991,134 | A | 11/1999 | Tan et al. |
| 6,002,156 | A | 12/1999 | Lin |
| 6,100,589 | A | 8/2000 | Tanaka |
| 6,103,548 | A | 8/2000 | Miks et al. |
| 6,144,100 | A | 11/2000 | Shen et al. |
| 6,174,803 | B1 | 1/2001 | Harvey |
| 6,187,658 | B1 | 2/2001 | Chittipeddi et al. |
| 6,198,138 | B1 | 3/2001 | Hirota |
| 6,222,710 | B1 | 4/2001 | Yamaguchi |
| 6,232,662 | B1 | 5/2001 | Saran |
| 6,242,814 | B1 | 6/2001 | Bassett |
| 6,291,898 | B1 | 9/2001 | Yeh et al. |
| 6,313,024 | B1 | 11/2001 | Cave et al. |
| 6,323,559 | B1 | 11/2001 | Chan et al. |
| 6,327,126 | B1 | 12/2001 | Miller et al. |
| 6,365,958 | B1 | 4/2002 | Ibnabdeljalil et al. |
| 6,384,486 | B2 | 5/2002 | Zuniga et al. |
| 6,385,021 | B1 | 5/2002 | Takeda et al. |
| 6,400,540 | B1 | 6/2002 | Chang |
| 6,476,506 | B1 | 11/2002 | O'Connor et al. |
| 6,576,958 | B2 | 6/2003 | Ker et al. |
| 6,590,296 | B2 | 7/2003 | Nakamura |
| 6,614,091 | B1 | 9/2003 | Downey et al. |
| 6,650,021 | B2 | 11/2003 | Stamper et al. |
| 6,675,053 | B2 | 1/2004 | Baluswamy et al. |
| 6,717,238 | B2 * | 4/2004 | Ker et al. ............ 257/602 |
| 6,717,270 | B1 | 4/2004 | Downey et al. |
| 6,724,603 | B2 | 4/2004 | Miller et al. |
| 6,740,985 | B1 | 5/2004 | Zhao |
| 6,765,282 | B2 | 7/2004 | Schulz |
| 6,767,817 | B2 * | 7/2004 | Farnworth et al. ......... 438/612 |
| 6,791,196 | B2 | 9/2004 | Kwon et al. |
| 6,798,077 | B2 | 9/2004 | Nakamura |
| 6,803,302 | B2 | 10/2004 | Pozder et al. |
| 6,804,808 | B2 | 10/2004 | Li et al. |
| 6,844,631 | B2 | 1/2005 | Yong et al. |
| 6,846,717 | B2 | 1/2005 | Downey et al. |
| 6,900,970 | B2 | 5/2005 | Miller et al. |
| 6,921,979 | B2 | 7/2005 | Downey et al. |
| 6,970,336 | B2 | 11/2005 | Stockinger et al. |
| 7,049,701 | B2 | 5/2006 | Usui |
| 7,057,296 | B2 * | 6/2006 | Hung et al. ............ 257/786 |
| 7,071,561 | B2 | 7/2006 | Chen |
| 7,081,679 | B2 | 7/2006 | Huang et al. |
| 7,209,332 | B2 | 4/2007 | Stockinger et al. |
| 7,247,552 | B2 | 7/2007 | Pozder et al. |
| 7,312,530 | B2 | 12/2007 | Hashimoto et al. |
| 2002/0025417 | A1 | 2/2002 | Chisholm et al. |
| 2003/0020163 | A1 | 1/2003 | Hung et al. |
| 2003/0218255 | A1 | 11/2003 | Park et al. |
| 2004/0109270 | A1 | 6/2004 | Stockinger et al. |
| 2004/0188848 | A1 * | 9/2004 | Nojiri et al. ............ 257/773 |
| 2005/0074918 | A1 * | 4/2005 | Lee et al. ............ 438/100 |
| 2005/0078419 | A1 | 4/2005 | Stockinger et al. |
| 2005/0082577 | A1 | 4/2005 | Usui |
| 2005/0087888 | A1 | 4/2005 | Rosefield et al. |
| 2005/0231878 | A1 | 10/2005 | Krasin |
| 2005/0242416 | A1 * | 11/2005 | Chen ............ 257/665 |
| 2005/0269697 | A1 * | 12/2005 | Yuzawa et al. ............ 257/737 |
| 2006/0121650 | A1 * | 6/2006 | Fogal et al. ............ 438/128 |
| 2006/0281200 | A1 | 12/2006 | Cadouri |
| 2007/0111376 | A1 | 5/2007 | Pendse |

FOREIGN PATENT DOCUMENTS

| | | |
|---|---|---|
| EP | 0851552 A1 | 7/1998 |
| GB | 2286287 A | 8/1995 |
| JP | 05-326610 | 12/1993 |
| JP | 10-012800 | 1/1998 |
| WO | 0227795 A2 | 4/2002 |

OTHER PUBLICATIONS

Anderson, W. et al.; "Cross-Referenced ESD Protection for Power Supplies"; EOS/ESD Symposium 98-96; pp. 2A 5.1 thru 2A 5.10' USA.

Dabral, S. et al.; "Core Clamps for Low Voltage Technologies"; pp. 3.6.1-3.6.9.

Ker, M. et al.; " ESD Protection Circuits with Novel MOS-Bounded Diode Structures"; 2002; pp. V-522 thru V-536; IEEE.

Merrill, R. et al.; "ESD Design Methodology"; EOS/ESD Symposium 93; pp. 5B.5.1 thru 5B.5.5.

Ramirez-Angulo et al.; "Programmable BiCMOS Transconductor for Capacitor-Transconductor Filters"; Electronics Letters; Jun. 18 1992; No. 13; pp. 1104-1107.

Stockinger, M. et al.; "Boosted and Distributed Rail Clamp Networks for ESD Protection in Advanced CMOS Technologies"; 2003; 11 Pgs.; ESD Association.

Torres, C.A.; "Modular, Portable, and Easily Simulated ESD Protection Networks for Advanced CMOS Technologies"; EOS/ESD Symposium Proceedings; 2001; 14 Pgs.

Wintgens, c.; "Detailed Structural Analysis 1 of the Oki Electric Co. Ltd. L67Q4003 21-Bit Microcontroller with Optional Analyses"; Sep. 2004; 7 Pgs; Semiconductor Insights, Inc.

Worley, E. R. et al.; "Sub-Micron Chip ESD Protection Schemes which Avoid Avalanching Junctions"; EOS/ESD Symposium; pp. 1.2.1-1/2/8.

U.S. Appl. No. 10/914,442 filed Dec. 10, 2002.

PCT/US01/30307 International Search Report and Written Opinion mailed Oct. 18, 2007 in PCT Application corresponding to U.S. Appl. No. 11/033,008.

Restriction Requirement mailed Feb. 12, 2007 in U.S. Appl. No. 11/033,008.

Notice of Allowance mailed May 1, 2007 in U.S. Appl. No. 11/033,008.

Office Action mailed Feb. 4, 2009 on U.S. Appl. No. 11/750,048.

Notice of Allowance mailed Aug. 13, 2009 on U.S. Appl. No. 11/750,048.

PCT/US05/21681 International Search Report and Written Opinion mailed Aug. 14, 2006 in PCT Application corresponding to U.S. Appl. No. 10/909,100.

Restriction Requirement mailed Dec. 15, 2005 in U.S. Appl. No. 10/909,100.

Office Action mailed Mar. 9, 2006 in U.S. Appl. No. 10/909,100.

PCT/US05/45203 International Search Report and Written Opinion mailed Jul. 3, 3007 in PCT Application corresponding to U.S. Appl. No. 11/056,617.

Office Action mailed Jun. 13, 2007 in U.S. Appl. No. 11/056,617.

Office Action mailed Nov. 23, 2007 in U.S. Appl. No. 11/056,617.

PAB Decision mailed Mar. 19, 2008 in U.S. Appl. No. 11/056,617.

PCT/US07/65619 International Search Report and Written Opinion mailed Feb. 13, 2008 in PCT Application corresponding to U.S. Appl. No. 11/383,656.

Restriction Requirement mailed Sep. 19, 2008 in U.S. Appl. No. 11/383,656.

Office Action mailed Jan. 7, 2009 in U.S. Appl. No. 11/383,656.

Office Action mailed Aug. 3, 2009 U.S. Appl. No. 11/383,656.

Office Action mailed Jan. 22, 2010 U.S. Appl. No. 11/383,656.

* cited by examiner

INTEGRATED CIRCUIT HAVING PADS AND INPUT/OUTPUT (I/O) CELLS

RELATED APPLICATIONS

This is related to U.S. patent application Ser. No. 11/383, 656, filed concurrently herewith, titled "INTEGRATED CIRCUIT HAVING PADS AND INPUT/OUTPUT (I/O) CELLS", and assigned to the assignee hereof.

This is related to U.S. patent application Ser. No. 11/056, 617, filed Feb. 11, 2005, titled "I/O CELL ESD SYSTEM", and assigned to the assignee hereof.

This is related to U.S. patent application Ser. No. 10/914, 442, filed Aug. 9, 2004, titled "ELECTROSTATIC DISCHARGE PROTECTION FOR AN INTEGRATED CIRCUIT", and assigned to the assignee hereof.

This is related to U.S. patent application Ser. No. 11/264, 557, filed Nov. 11, 2005, titled "ELECTROSTATIC DISCHARGE (ESD) PROTECTION CIRCUIT FOR MULTIPLE POWER DOMAIN INTEGRATED CIRCUIT", and assigned to the assignee hereof.

This is related to U.S. patent application Ser. No. 11/033, 008, filed Jan. 11, 2005, titled "METHOD AND APPARATUS FOR PROVIDING STRUCTURAL SUPPORT FOR INTERCONNECT PAD WHILE ALLOWING SIGNAL CONDUCTANCE", and assigned to the assignee hereof.

This is related to U.S. patent application Ser. No. 10/909, 100, filed Jul. 30, 2004, titled "PROBE PAD ARRANGEMENT FOR AN INTEGRATED CIRCUIT AND METHOD OF FORMING", and assigned to the assignee hereof.

FIELD OF THE INVENTION

The present invention relates to an integrated circuit, and more particularly, to an integrated circuit having pads and input/output cells.

RELATED ART

As the physical geometries of circuitry formed on integrated circuits are reduced, significant problems may arise if the pads, such as, for example, bond pads and probe pads, are scaled to the same degree as the circuitry. The equipment used to make connections to the pads may not be able to adequately handle the significantly reduced geometries desired for the pads. In addition, the connections which utilize smaller pads may not be as reliable.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Increasing numbers of I/O cells as well as smaller physical geometries on integrated circuits have driven a need for smaller pitch I/O cells and smaller corresponding bond pads. Smaller pitch bond pads imply substantially smaller bond pad size and pitch. Unfortunately in many cases, the bond pad size and pitch is scaling faster than the capability of wire bond tools. Smaller bond pad size will require smaller ball bond diameter. The smaller geometry of ball bonds reduces manufacturing yield and reduces the long term interconnect reliability. This is because smaller ball bonds usually require smaller wire diameters and smaller tooling dimensions in wire bond equipment. One useful goal is to enlarge the bonding pad size so as to allow a larger ball bond while maintaining the finer pitch of the associated I/O cells. It is also desirable not to increase or to minimally increase the die size or the semiconductor area required by the integrated circuit. Similarly, it is also desirable to enlarge the probe pad size while maintaining the finer pitch of the associated I/O cells so that probe may be performed more easily and with less expensive probe equipment.

Figure 1:
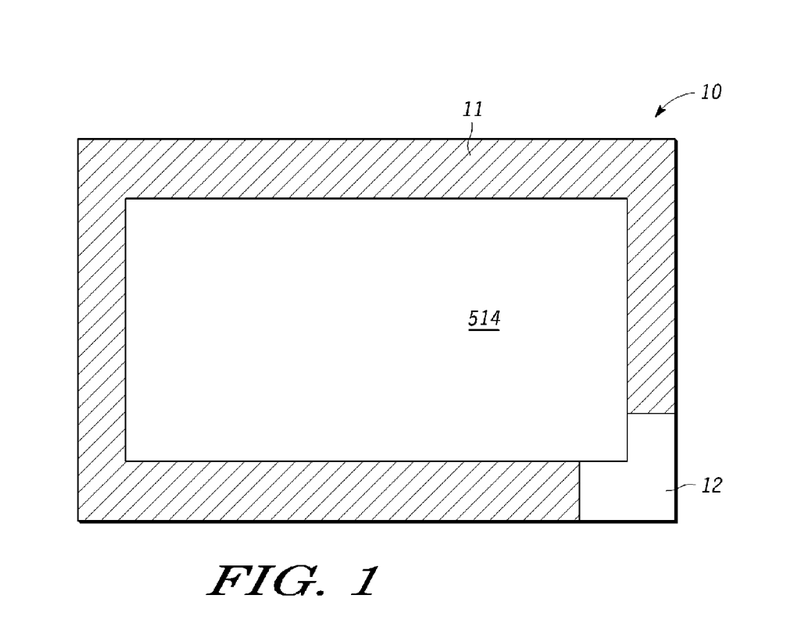
FIG. 1 illustrates a top view of an integrated circuit having a pad portion in accordance with one embodiment of the present invention.

FIG. 1 illustrates a top view of an integrated circuit (IC) 10 having a core area 514, an I/O area 11, and an I/O portion 12 in accordance with one embodiment of the present invention. In the illustrated embodiment, the I/O portion 12 is located within the I/O area 11. The I/O area 11 is an area of IC 10 in which I/O cells and pads for the IC 10 are located. In one embodiment, the I/O area 11 is located around all or most of the peripheral area of the integrated circuit 10. Alternate embodiments of IC 10 may locate the I/O area 11 anywhere on IC 10. In addition, in alternate embodiments, the geometric shape of I/O area 11 may not be rectangular, but may be any desired shape or shapes. Also, in alternate embodiments, I/O area 11 may be comprised of any number of non-contiguous shapes.

Figure 2:
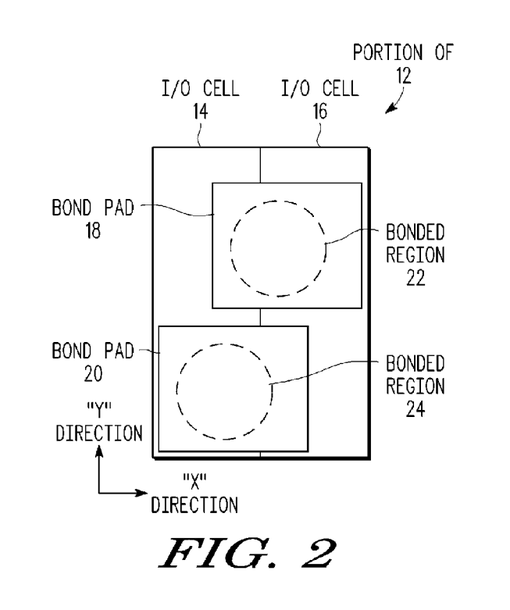
FIGS. 2-9 illustrate a top view of a pad portion of an integrated circuit of FIG. 1 in accordance with alternate embodiments of the present invention.

FIG. 2 illustrates one embodiment of a pad portion 12 or I/O portion 12 of integrated circuit 10 of FIG. 1. In one embodiment, portion 12 includes multiple I/O cells 14, 16. Note that the term "I/O cell" encompasses an input-only cell, an output-only cell, or an input and output cell. Likewise note that the terms "I/O pad" and "pad" encompass a pad that conveys only an input signal, only an output signal, or both an input signal and an output signal. As used herein, the term "I/O pads" include one or more bond pads and/or one or more probe pads. Bond pads may also include wire bond pads, bump bond pads, or any other type of bond pad.

In physical layout, I/O cells (e.g. I/O cells 300-310, 350-360 of FIG. 9) are placed adjacent to each other to form one or more linear banks of I/O cells occupying a specific area (e.g. I/O area 11 in FIG. 1) of the IC 10. In some embodiments, each I/O cell 14, 16 (see FIG. 2) has the same structure and includes a bond pad 20, 18, respectively. In alternate embodiments, one or more I/O cells 14, 16 may have a different structure and may still utilize bond pads 20, 18, respectively. Note that each of the bond pads 18, 20 may be used as an interconnection point between circuitry internal to IC 10, and circuitry external to IC 10 (not shown).

FIG. 2 illustrates a bond pad 20 which is electrically connected to a first I/O cell 14 while also physically overlaying active circuitry of a second I/O cell 16. Bond pad 18 is electrically connected to an I/O cell 16 while also physically overlaying active circuitry of a second I/O cell 14. Note that I/O cell 14 is electrically connected to pad 20, and I/O cell 16 is electrically connected to pad 18. Pad 18 has a bonded region 22 which is the intended region for the ball bond (not shown) when wire bonding is performed. Pad 20 has a bonded region 24 which is the intended region for the ball bond (not shown) when wire bonding is performed. Note that by allowing the pads 18, 20 to overlie adjacent I/O cells (14 and 16, respectively), the size of the pads 18, 20 may be increased, thus allowing the diameter of the ball bonds to be increased. Increasing the size of the ball bonds improves the manufacturability and long term reliability of the interconnect (e.g. wire bonds).

Note that in the embodiment illustrated in FIG. 2 the bond pads 18, 20 are not placed in a single horizontal row. As used herein, the term horizontal refers to the "x" direction, and the term "vertical" refers to the "y" direction. Instead, the pads 18, 20 are vertically displaced relative to each other so that each bond pad 18, 20 may be widened in the horizontal direction without any overlapping of bond pads 18, 20. If bond pads 18, 20 had been placed side by side in a same horizontal row, they would have been required to be more narrow so that they did not overlap. Narrower bond pads would have required smaller ball bond diameters. A smaller geometry of ball bonds would have reduced manufacturing yield and would have reduced the long term interconnect reliability. This was not desirable.

Note that for the illustrated embodiment, the "x" direction in the figures is parallel to the outside edge of IC 10, and the "y" direction is perpendicular to the outside edge of IC 10. For example, referring to FIG. 9, the "x" direction for I/O cells 300-310 is parallel to edge 396 and the "y" direction for I/O cells 300-310 is perpendicular to edge 396; similarly, the "x" direction for I/O cells 350-360 is parallel to edge 398 and the "y" direction for I/O cells 350-360 is perpendicular to edge 398.

As used herein, the term "I/O cell" is generally assumed to include conductors and active devices for a wide variety of purposes, such as, for example, for normal I/O functionality, for ESD (electro-static discharge) protection, for local interconnect between all these devices, and for power and/or ground buses (herein called power buses). In one embodiment, the power buses provide the required power and/or ground voltages to cells (e.g. 14, 16), to the bond pads (e.g. 18, 20), and/or to the probe pads (e.g. 60, 61 of FIG. 5). For some embodiments, the bond pads and probe pads provide electrical coupling to the outside world beyond IC 10. For some embodiments, the active devices used for normal I/O functionality include, as examples, p-channel field effect transistors (e.g. PMOSFETs) and n-channel field effect transistors (e.g. NMOSFETs), output drivers, predriver circuitry, input buffers, and other circuit components typically included for normal I/O operation. Alternate embodiments may use any desired device or devices in an I/O cell.

Note that in the illustrated embodiment, the width of bond pad 18 is wider than the width of I/O cell 16, and the width of bond pad 20 is wider than the width of I/O cell 14. Note that as used herein, the term "wider" refers to the "x" direction. Wider pads (e.g. 18) can be formed and used due to the fact that a pad (e.g. 18) is connected to an I/O cell (e.g. 16) to communicate the signal from that I/O cell (e.g. 16) while also being allowed to overlie a different I/O cell (e.g. 14). The wider pads 18, 20 allow for more reliable and manufacturable wire bonds to those pads 18, 20. Note that for these widths in the illustrated embodiment, the bond pad width and the I/O cell width are measured along substantially parallel lines. Note also that I/O cell 14 and I/O cell 16 are adjacent.

Figure 3:
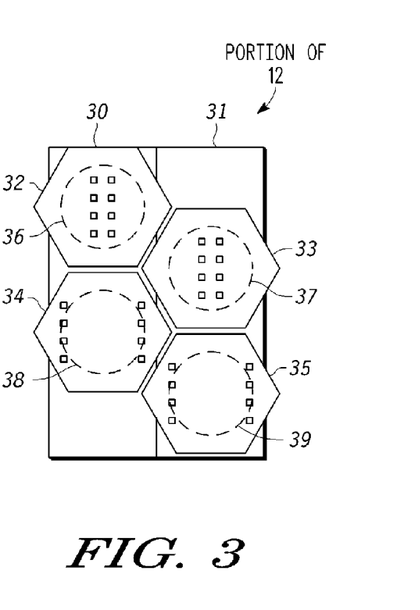

FIG. 3 illustrates a top view of a pad portion 12 of integrated circuit 10 of FIG. 1 in accordance with an alternate embodiment of the present invention. As used herein, the term "power bond pad" refers to a bond pad (e.g. 34, 35) used for either power or ground interconnection. Similarly, as used herein, the term "signal bond pad" refers to a bond pad (e.g. 32, 33) used for interconnection of a signal, where the signal is not solely providing either power or ground. Note that each signal bond pad (e.g. 32) and its corresponding signal bonded region (e.g. 36) are associated with one I/O cell to which it is electrically connected. However, each signal bond pad may be located wherever desired on IC 10 and no longer must overlie its associated I/O cell. Each power bond pad (e.g. 34) and its corresponding power bonded region (e.g. 38) is associated with one power interconnect conductor (not shown) to which it is electrically connected. This power interconnect conductor may be considered to be part of a corresponding I/O cell (e.g. 30).

Note that each signal bond pad (e.g. 32, 33) and power bond pad (e.g. 34, 35) may be located wherever desired on IC 10. In particular, the power bond pads are not restricted to the die edge, and the signal bond pads are not restricted to the interior; alternate embodiments might have bond pads 32 and 33 as the power bond pads, and bond pads 34 and 35 as the signal bond pads; additional alternate embodiments might have bond pads 32 and 34 as the power bond pads, and bond pads 33 and 35 as the signal bond pads. However, due to the fact that the underlying layers must withstand the impact of the wire bonding process, the signal bond pads and power bond pads are generally placed overlying the I/O cells (e.g. 30, 31). Also, in some embodiments, the power and ground buses are routed through the I/O cell as part of the I/O cells. In alternate embodiments, the power buses may not be routed through the I/O cells, but may be routed elsewhere on IC 10.

FIG. 3 illustrates one embodiment of a pad portion 12 or I/O portion 12 of integrated circuit 10 of FIG. 1. In one embodiment, portion 12 includes multiple I/O cells 30, 31. Bond pads 32, 34 are electrically connected to a first I/O cell 30 while also physically overlaying active circuitry of a second I/O cell 31. Bond pads 33, 35 are electrically connected to an I/O cell 31 while also physically overlaying active circuitry of a second I/O cell 30. Note that I/O cell 30 is electrically connected to pads 32, 34, and I/O cell 31 is electrically connected to pads 33, 35. Pad 32 has a bonded region 36 which is the intended region for the ball bond (not shown) when wire bonding is performed. Pad 34 has a bonded region 38 which is the intended region for the ball bond (not shown) when wire bonding is performed. Pad 33 has a bonded region 37 which is the intended region for the ball bond (not shown) when wire bonding is performed. Pad 35 has a bonded region 39 which is the intended region for the ball bond (not shown) when wire bonding is performed. Note that by allowing the pads 32, 34 and 33, 35 to overlie adjacent I/O cells (31 and 30, respectively) the size of the pads 32-35 may be increased, thus allowing the diameter of the ball bonds to be increased. Increasing the size of the ball bonds improves the manufacturability and long term reliability of the interconnect (e.g. wire bonds).

Note that one way in which the embodiment of FIG. 3 differs from the embodiment of FIG. 2 is that there is not enough vertical space to place the bond pads (32, 33) in separate rows. Likewise, there is not enough vertical space to place the bond pads (33, 34) in separate rows, and there is not enough vertical space to place the bond pads (34, 35) in separate rows. Thus, unlike FIG. 2 which illustrates total vertical displacement (i.e. full staggering) between pads 18 and 20, FIG. 3 illustrates only partial vertical displacement (i.e. partial staggering) between pads 32 and 33, between pads 33 and 34, and also between pads 34 and 35. As a result, the bond pads 32 and 33 are only partially staggered in the "y" direction. Likewise, the bond pads 33 and 34 are only partially staggered in the "y" direction; and the bond pads 34 and 35 are only partially staggered in the "y" direction.

In addition, the hexagonal shape of the bond pads 32-35 of FIG. 3 lends itself to tight packing when partial staggering, rather then full staggering, is used. Note that alternate embodiments may use any desired shapes or combination of shapes for bond pads 32-35, such as, for example, square, diamond, rectangular, octagonal, circular, oval, curved, etc. Other embodiments may use any polygon or curved shape or shapes and varying orientations that pack with the desired compactness.

Unlike the embodiment of FIG. 2, each I/O cell 30, 31 illustrated in FIG. 3 has a plurality of bond pads connected to it (e.g. pads 32, 34 for I/O cell 30). In one embodiment, one of the bond pads (e.g. 34) is a power bond pad and connects to the power or ground bus portions located in I/O cell 30, and the other bond pad (e.g. 32) is a signal bond pad and connects to the circuitry within the I/O cell 30 itself in order to communicate the I/O signal to/from the I/O cell 30. In an alternate embodiment, there may be partial staggering with only one row of bond pads. In other words, bond pads 32 and 33 may be arranged in a partially staggered manner, and bond pads 34 and 35 may be omitted. Note that the little squares within the bond pads 32-35 represent vias used to make the underlying connection to their respective bond pads 32-35. In one embodiment, the bond pads (e.g. 34, 35) closer to the edge of IC 10 are used as power bond pads, and the bond pads (e.g. 32, 33) farther from the edge of IC 10 are used as signal bond pads.

Note that for some embodiments, restrictive layout design rules for the interconnect layers (e.g. power and ground buses) below the bonded regions 36-39 in the I/O cells 30, 31 are used to prevent damage during wire bonding. The restrictive layout design rules provide sufficient structural support to prevent damage to IC 10 during the physical stress of the wire bonding process. However, most ICs 10 do not have these same restrictive layout design rules for the interconnect layers in other portions of the IC 10 (e.g. core area 514 of FIG. 1 where functional circuitry may be located, such as, for example, memory, execution units, registers, state machines, control logic, arithmetic logic, timers, etc.). Thus, there may be significant restrictions in the ability to place bonded regions 36-39 over region 514. The interconnect layers between bonded regions 36-39 and the underlying active circuitry in region 514 may not be sufficient to protect the underlying circuitry, particularly the dielectric layers, from damage during wire bonding unless the more restrictive layout rules are used. It is not generally desirable to use these more restrictive interconnect layout rules in region 514 because the more restrictive layout rules reduce design flexibility and may require more semiconductor area. Thus, for some embodiments, the bonded regions 36-39 are restricted to being located within the I/O area 11.

Figure 4:
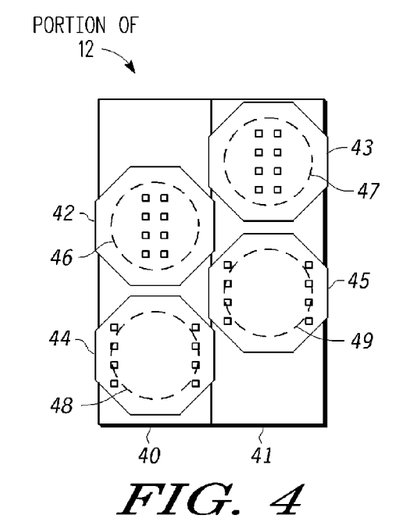

FIG. 4 illustrates a top view of a pad portion 12 of integrated circuit 10 of FIG. 1 in accordance with an alternate embodiment of the present invention. Note that the embodiment illustrated in FIG. 4 uses octagonal shapes for bond pads 42-45. The reason for this is that octagonal shapes may be more compatible with computer aided design (CAD) tools that limit the vertices of a pad to 45 degrees or 90 degrees. Thus, the vertices of 30 degrees and 60 degrees required by a hexagonal shape may not be supported, or not easily supported, by some CAD tools used to design integrated circuits. Again, the shapes used for bond pads (e.g. 42-45) may be any desired shape; however, some shapes may have an advantage in particular embodiments.

Still referring to FIG. 4, bond pads 42, 44 are electrically connected to a first I/O cell 40 while also physically overlaying active circuitry of a second I/O cell 41. Bond pads 43, 45 are electrically connected to an I/O cell 41 while also physically overlaying active circuitry of a second I/O cell 40. Note that I/O cell 40 is electrically connected to pads 42, 44, and I/O cell 41 is electrically connected to pads 43, 45. Pad 42 has a bonded region 46 which is the intended region for the ball bond (not shown) when wire bonding is performed. Pad 44 has a bonded region 48 which is the intended region for the ball bond (not shown) when wire bonding is performed. Pad 43 has a bonded region 47 which is the intended region for the ball bond (not shown) when wire bonding is performed. Pad 45 has a bonded region 49 which is the intended region for the ball bond (not shown) when wire bonding is performed. Note that by allowing the pads 42, 44 and 43, 45 to overlie adjacent I/O cells (41 and 40, respectively) the size of the pads 42-45 may be increased, thus allowing the diameter of the ball bonds to be increased. Increasing the size of the ball bonds improves the manufacturability and long term reliability of the interconnect (e.g. wire bonds).

Figure 5:
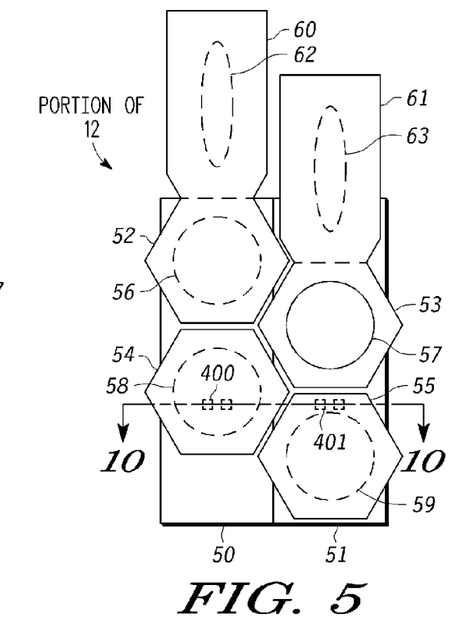

FIG. 5 illustrates a top view of a pad portion 12 of integrated circuit 10 of FIG. 1 in accordance with an alternate embodiment of the present invention. FIG. 5 illustrates the use of a separate probe pad 60 that is electrically coupled to its corresponding bond pad 52 for communicating the same signal from probe pad 60 and bond pad 52. A separate probe pad 61 that is electrically coupled to its corresponding bond pad 53 is also shown. Probe pad 60 may be implemented as an extension of bond pad 52, and probe pad 61 may be implemented as an extension of bond pad 53. Probe pad 60 has a probe region 62 which is the intended region for the probe tip (not shown) touchdown and scrub when probing is performed. Probe pad 61 has a probe region 63 which is the intended region for the probe tip (not shown) touchdown and scrub when probing is performed. In the illustrated embodiment, bond pads 54 and 55 have bonded regions 58 and 59 which are the intended region for the ball bond (not shown) when wire bonding is performed for the purpose of creating a power and/or ground electrical connection. The corresponding probe regions for bond pads 54 and 55 may be elsewhere on IC 10.

Note that the probe process generally does not exert the same perpendicular forces on the underlying circuitry as is exerted by wire bonding. Thus, the probe regions 62, 63 do not have to stay overlying I/O cells (e.g. 50, 51) but may be extended so that they are overlying region 514. In one embodiment, bond pads 52-55 and probe pads 60, 61 are formed of aluminum. In alternate embodiments, bond pads 52-55 and probe pads 60, 61 may be formed of any conductive material. Note that aluminum may be used for bond pads 52-55 and probe pads 60, 61 even when a different material (e.g. copper) is used for underlying interconnect layers. Note that for one embodiment, the probe pads 60, 61 are formed overlying a passivation layer, and thus may be formed overlying region 514. Note that bond pads 52, 53 may also be formed over passivation like probe pads 60, 61.

In some embodiments, it may be beneficial to have separate probe and wire bond regions. The probe needle (during the probe process) may physically damage the top layer of the pad region; and thus wire bond reliability and manufacturability may be negatively impacted if the same pads are used for probe and wire bonding.

FIG. 5 illustrates a top view of a pad portion 12 of integrated circuit 10 of FIG. 1 in accordance with an alternate embodiment of the present invention. In one embodiment, bond pads 54, 55 are used as power bond pads and bond pads 52, 53 are used as signal bond pads. Note that each signal bond pad (e.g. 52) and its corresponding signal bonded region (e.g. 56) are associated with one I/O cell to which it is electrically connected. However, each signal bond pad may be located wherever desired on IC 10 and no longer must overlie its associated I/O cell. Each power bond pad (e.g. 54) and its corresponding power bonded region (e.g. 58) is associated with one power interconnect conductor (not shown) to which it is electrically connected. This power interconnect conductor may be considered to be part of a corresponding I/O cell (e.g. 50).

Note that each signal bond pad (e.g. 52, 53) and power bond pad (e.g. 54, 55) may be located wherever desired on IC 10. However, due to the fact that the underlying layers must withstand the impact of the wire bonding process, the signal bond pads and power bond pads are generally placed overlying the I/O cells (e.g. 50, 51) or within the I/O area 11. Also, in some embodiments, the power and ground buses are routed through the I/O cell as part of the I/O cells. In alternate embodiments, the power buses may not be routed through the I/O cells, but may be routed elsewhere on IC 10.

FIG. 5 illustrates one embodiment of a pad portion 12 or I/O portion 12 of integrated circuit 10 of FIG. 1. In one embodiment, portion 12 includes multiple I/O cells 50, 51. Bond pads 52, 54 are electrically connected to a first I/O cell 50 while also physically overlaying active circuitry of a second I/O cell 51. Bond pads 53, 55 are electrically connected to an I/O cell 51 while also physically overlaying active circuitry of a second I/O cell 50. Note that I/O cell 50 is electrically connected to pads 52, 54, and I/O cell 51 is electrically connected to pads 53, 55. Pad 52 has a bonded region 56 which is the intended region for the ball bond (not shown) when wire bonding is performed. Pad 54 has a bonded region 58 which is the intended region for the ball bond (not shown) when wire bonding is performed. Pad 53 has a bonded region 57 which is the intended region for the ball bond (not shown) when wire bonding is performed. Pad 55 has a bonded region 59 which is the intended region for the ball bond (not shown) when wire bonding is performed.

Note that by allowing the pads 52, 54 and 53, 55 to overlie adjacent I/O cells (51 and 50, respectively) the size of the pads 52-55 may be increased, thus allowing the diameter of the ball bonds to be increased. Increasing the size of the ball bonds improves the manufacturability and long term reliability of the interconnect (e.g. wire bonds). In addition, the small squares 400 within the bond pad 54 represent vias used to make the underlying connection from conductors in I/O cell 50 to bond pad 54. Similarly, the small squares 401 within the bond pad 55 represent vias used to make the underlying connection from conductors in I/O cell 51 to bond pad 55.

Figure 6:
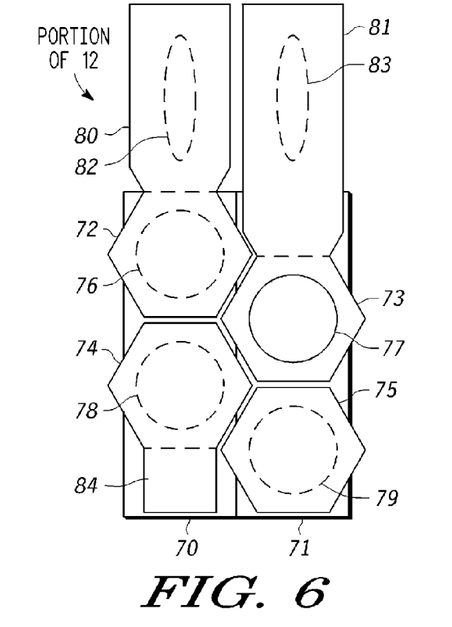

FIG. 6 illustrates a top view of a pad portion 12 of integrated circuit 10 of FIG. 1 in accordance with an alternate embodiment of the present invention. FIG. 6 is similar to FIG. 5, except the length of probe pad 81 is extended vertically so that probe regions 82, 83 align at the top. For some embodiments, this alignment allows for ease of the probe process and probe card maintenance because it is easier to verify alignment of probe needles when all needles on a side are expected to be in a straight line. In some embodiments, pad extension 84 may be added to bond pad 74 so that 84 and 74 in combination produces a region that may be probed. This probe region may or not be used for wire bonding. Some embodiments may use redundant power bond pads 74 so that a portion of these pads may be probed, and a different portion may be wire bonded to avoid the problem of wire bonding over probe damage.

FIG. 6 illustrates a top view of a pad portion 12 of integrated circuit 10 of FIG. 1 in accordance with an alternate embodiment of the present invention. In one embodiment, bond pads 74, 75 are used as power bond pads and bond pads 72, 73 are used as signal bond pads. Note that each signal bond pad (e.g. 72) and its corresponding signal bonded region (e.g. 76) are associated with one I/O cell to which it is electrically connected. However, each signal bond pad may be located wherever desired on IC 10 and no longer must overlie its associated I/O cell. Each power bond pad (e.g. 74) and its corresponding power bonded region (e.g. 78) is associated with one power interconnect conductor (not shown) to which it is electrically connected. This power interconnect conductor may be considered to be part of a corresponding I/O cell (e.g. 70).

Note that each signal bond pad (e.g. 72, 73) and power bond pad (e.g. 74, 75) may be located wherever desired on IC 10. However, due to the fact that the underlying layers must withstand the impact of the wire bonding process, the signal bond pads and power bond pads are generally placed overlying the I/O cells (e.g. 70, 71). Also, in some embodiments, the power and ground buses are routed through the I/O cell as part of the I/O cells. In alternate embodiments, the power buses may not be routed through the I/O cells, but may be routed elsewhere on IC 10.

FIG. 6 illustrates one embodiment of a pad portion 12 or I/O portion 12 of integrated circuit 10 of FIG. 1. In one embodiment, portion 12 includes multiple I/O cells 70, 71. Bond pads 72, 74 are electrically connected to a first I/O cell 70 while also physically overlaying active circuitry of a second I/O cell 71. Bond pads 73, 75 are electrically connected to an I/O cell 71 while also physically overlaying active circuitry of a second I/O cell 70. Note that I/O cell 70 is electrically connected to pads 72, 74, and I/O cell 71 is electrically connected to pads 73, 75. Pad 72 has a bonded region 76 which is the intended region for the ball bond (not shown) when wire bonding is performed. Pad 74 has a bonded region 78 which is the intended region for the ball bond (not shown) when wire bonding is performed. Pad 73 has a bonded region 77 which is the intended region for the ball bond (not shown) when wire bonding is performed. Pad 75 has a bonded region 79 which is the intended region for the ball bond (not shown) when wire bonding is performed.

Note that by allowing the pads 72, 74 and 73, 75 to overlie adjacent I/O cells (71 and 70, respectively) the size of the pads 72-75 may be increased, thus allowing the diameter of the ball bonds to be increased. Increasing the size of the ball bonds improves the manufacturability and long term reliability of the interconnect (e.g. wire bonds).

Figure 7:
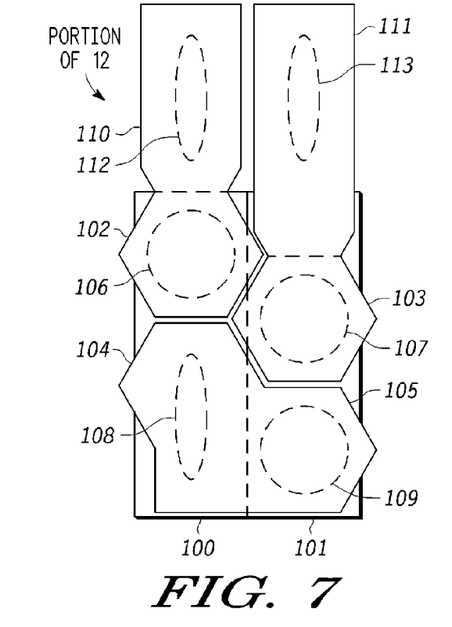

FIG. 7 illustrates a top view of a pad portion 12 of integrated circuit 10 of FIG. 1 in accordance with an alternate embodiment of the present invention. FIG. 7 is similar to FIG. 6, except adjacent pads from FIG. 6 (namely 74, 75) have been merged (electrically and physically connected) so that region 108 may be used for probe and region 109 may be used for wire bonding. Thus the wire bonding region 109 will not have any probe damage.

Referring to FIG. 7, in one embodiment, bond pad 104 is used as a power bond pad having a wire bond region 109 and having a probe region 108. In one embodiment, bond pads 102, 103 are used as signal bond pads. Note that each signal bond pad (e.g. 102) and its corresponding signal bonded region (e.g. 106) are associated with one I/O cell to which it is electrically connected. However, each signal bond pad may be located wherever desired on IC 10 and no longer must overlie its associated I/O cell. The power bond pad 104 and its corresponding power bonded regions (e.g. 108 and 109) is associated with one power interconnect conductor (not shown) to which it is electrically connected. This power interconnect conductor may be considered to be part of a corresponding I/O cell (e.g. 100).

Note that the power bond pad 104 may be located wherever desired on IC 10. However, due to the fact that the underlying layers must withstand the impact of the wire bonding process, the power bond pads are generally placed overlying the I/O cells (e.g. 100, 101). Also, in some embodiments, the power and ground buses are routed through the I/O cell as part of the I/O cells. In alternate embodiments, the power buses may not be routed through the I/O cells, but may be routed elsewhere on IC 10.

FIG. 7 illustrates one embodiment of a pad portion 12 or I/O portion 12 of integrated circuit 10 of FIG. 1. In one embodiment, portion 12 includes multiple I/O cells 100, 101. Bond pad 102 is electrically connected to a first I/O cell 100 while also physically overlaying active circuitry of a second I/O cell 101. Bond pad 103 is electrically connected to an I/O cell 101 while also physically overlaying active circuitry of a second I/O cell 100. Pad 102 has a bonded region 106 which is the intended region for the ball bond (not shown) when wire bonding is performed. Pad 104 has a region 108 which is the intended region to receive a probe needle for probing at least a portion of IC 10. Pad 104 also has a bonded region 109 which is the intended region for the ball bond (not shown) when wire bonding is performed. Pad 103 has a bonded region 107 which is the intended region for the ball bond (not shown) when wire bonding is performed.

Note that by allowing the pads 102, 103, and 104 to overlie adjacent I/O cells 100, 101, the size of the pads 102-104 may be increased, thus allowing the diameter of the ball bonds to be increased and allowing the area of the probe region to be increased. Increasing the size of the ball bonds improves the manufacturability and long term reliability of the interconnect (e.g. wire bonds).

Figure 8:
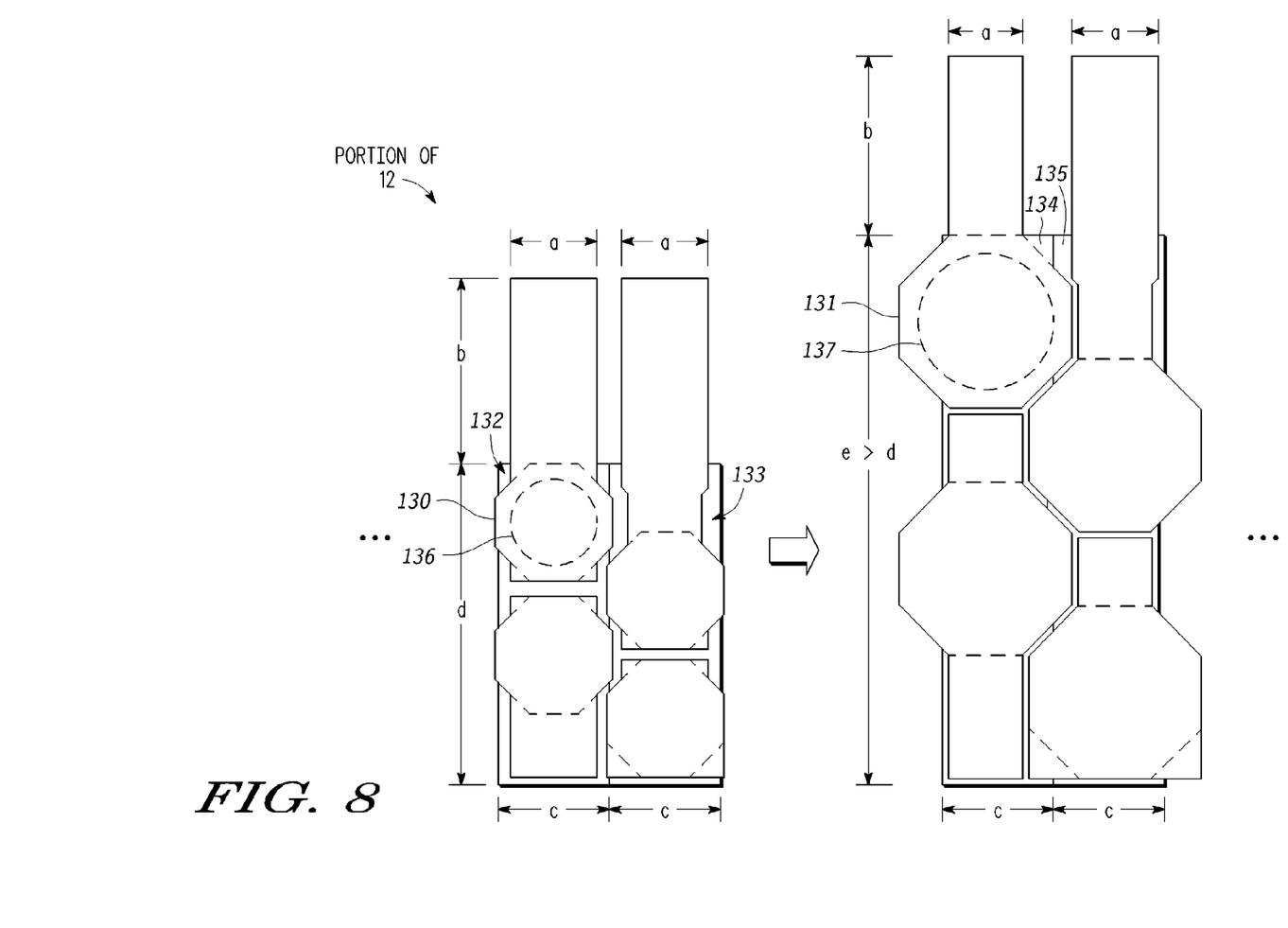

FIG. 8 illustrates a top view of a pad portion 12 of integrated circuit 10 of FIG. 1 in accordance with an alternate embodiment of the present invention. Note that it is possible to have I/O cells of varying sizes depending on the I/O cell's functionality. If an I/O cell can be expanded in the vertical direction, it is now possible to make the bond pads (e.g. 130) substantially larger (e.g. 131) while still maintaining the same horizontal dimension (pitch) of the I/O cells (see horizontal "x" dimension having a value "c"). As a result, bond pad 131 may have a substantially larger size and area than bond pad 130.

High pin count ICs often cannot fit all I/O cells in a single row around the I/O periphery without significantly increasing the die size. In one embodiment, the present invention may be used to solve this problem because the width of the bond pad (e.g. width of pad 131) is no longer limited by the width of the I/O cell ("c"). This allows the width of the I/O cell to be narrowed, while still maintaining or even enlarging the width of the bond pad. In the embodiment illustrated in FIG. 8, the width "c" of the I/O cells 134, 135 are the same as the width of the I/O cells 132, 133; however, the width of the bond pad 131 may be made substantially larger than "c".

Dimensions "a" and "b" denote the dimension of the separate probe pad that is electrically coupled to its corresponding bond pad for communicating the same signal from probe pad and bond pad.

Pad 130 has a bonded region 136 which is the intended region for the ball bond (not shown) when wire bonding is performed. Pad 131 has a bonded region 137 which is the intended region for the ball bond (not shown) when wire bonding is performed. By taking advantage of the larger vertical dimension "e" of I/O cell 134, the bonded region 137 of pad 131 may have a substantially larger size than the bonded region 136 of pad 130, thus allowing the diameter of the ball bonds to be substantially increased. Increasing the size of the ball bonds improves the manufacturability and long term reliability of the interconnect (e.g. wire bonds).

Note that for some embodiments, the vertical dimension of the I/O cell may be increased (i.e. the vertical dimension "e" of I/O cells 134, 135 may be larger than the vertical dimension "d" of I/O cells 132, 133). Most IC designs have more flexibility to expand in the vertical dimension of an I/O cell than in the horizontal dimension of an I/O cell. In addition, most IC designs place a limit on the bond pad size and width, since increasing the bond pad size or width might cause the size die to increase. FIG. 8 illustrates a way to increase the size and width of a bond pad (from the size of pad 130 to the size of pad 131) without increasing the pitch or width of the I/O cells 132-135, and thus without increasing the die size. Note that I/O cells 134, 135 still have the same width and pitch "c" as I/O cells 132, 133.

Figure 9:
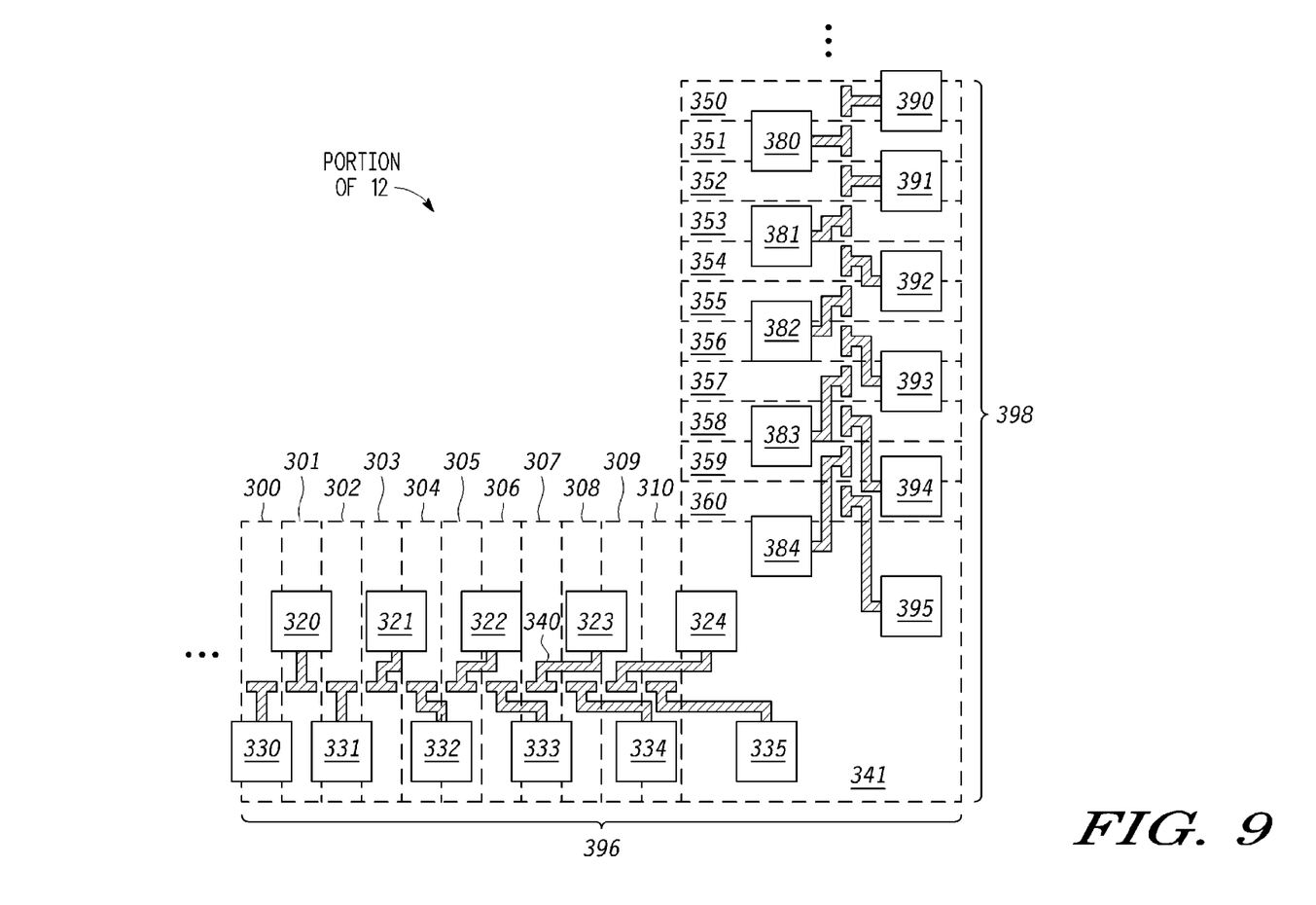

FIG. 9 illustrates a top view of a pad portion 12 of integrated circuit 10 of FIG. 1 in accordance with an alternate embodiment of the present invention. Note that in the illustrated embodiment, the location of bond pads 320-324, 330-335, 380-384, and 390-395 are spread out as the corner of IC 10 is approached. This is done in order to maintain a minimum pitch between wires (not shown) that are bonded to the bond pads. Note that the wires would become squeezed more closely together at the corners if the pitch between the bond pads was not increased as the corner was approached. However, note that the pitch of the I/O cells 300-310 and 350-360 can remain constant (abutted without any gap or space) while the bond pads 320-324, 330-335, 380-384, 390-395 can become more spread out as the corner of IC 10 is approached. Since the pitch of the I/O cells 300-310, 350-360 is not increased as the corner is approached, more I/O cells 300-310, 350-360 may be squeezed along the periphery of IC 10. Thus, the pitch or spacing for bond pads (e.g. 320-324, 330-335, 380-384, 390-395) can be increased at the corners of IC 10, while maintaining the closest possible pitch or spacing for the I/O cells (e.g. 300-310, 350-360). In the illustrated embodiment, this difference in bond pad pitch and I/O cell pitch is made possible by allowing bond pads (e.g. 320-324, 330-335, 380-384, 390-395) to overlie any I/O cell: not just the I/O cell to which each bond pad is electrically connected.

Normally a corner cell 341 remains unused for I/O cells and pads. However, in the present invention, corner cell 341 may be used for bond pads. Note that in some embodiments, one or more additional I/O cells (not shown) may be added either horizontally or vertically if desired. In addition, more bond pads may be added overlying corner cell 341 if there is sufficient space. The hatched filled shapes (e.g. 340) are conductors that are used to connect each I/O cell 300-310, 350-360 to one or more corresponding bond pads 320-324, 330-335, 380-384, 390-395. Note that in the illustrated embodiment, as the corner is approached, the offset between the I/O cell and its corresponding bond pad is increased.

The embodiment illustrated in FIG. 9 assumes that each I/O cell has one corresponding bond pad. In alternate embodiments, each I/O cell may have more than one bond pad, such as a signal bond pad plus one or more associated power bond pads (see FIG. 3). Alternate embodiments may also have one or more probe pads associated with some or all of the I/O cells. Bond pads may be any shape (e.g. see FIGS. 3 and 4)

and may be any size that meets the design rule criteria. Alternate embodiments may have only a single row of bond pads, may have two rows of bond pads, or may have any number of rows of bond pads.

Figure 10:
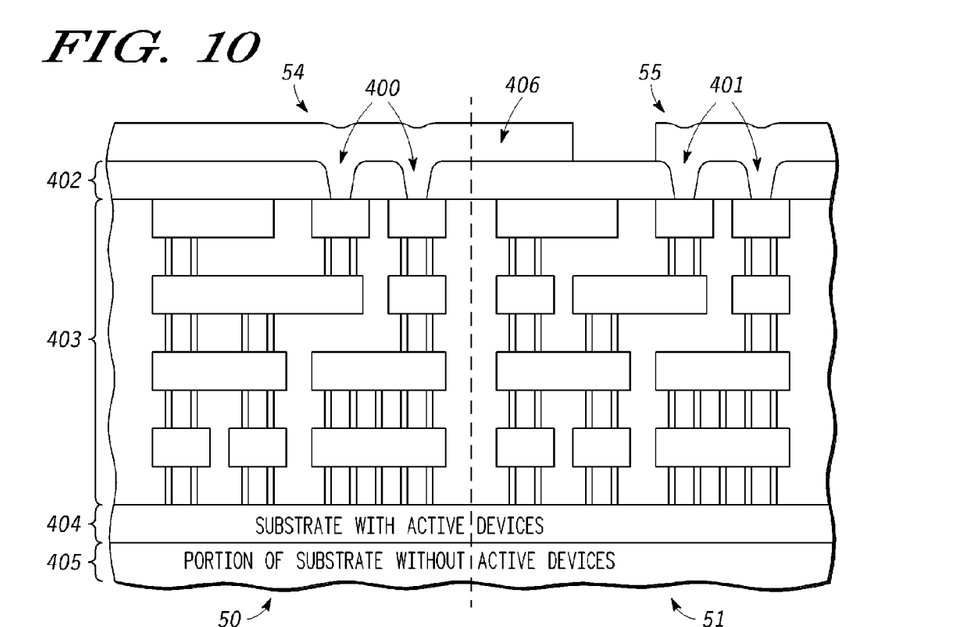
FIG. 10 illustrates a cross-section view of a pad portion of an integrated circuit of FIG. 5 in accordance with one embodiment of the present invention.

FIG. 10 illustrates a cross-section view of a pad portion 12 of integrated circuit 10 of FIG. 5 in accordance with one embodiment of the present invention. Note that the cross-section is cutting between power buses. Note that a portion 406 of bond pad 54 (connected to active circuitry within I/O cell 50) overlies at least a portion of active circuitry in I/O cell 51. Also, note that in some embodiments, bond pad 54 may be formed of a single layer (e.g. aluminum). In alternate embodiments, bond pad 54 may be formed of a plurality of layers of different materials (e.g. a layer of aluminum overlying a layer of copper). In some embodiments, a barrier layer (e.g. tantalum) may be interposed between the aluminum and copper layers. In one embodiment, layer 402 is a dielectric layer. Layer 402, in some embodiments, may be a passivation layer formed using a passivation material.

Still referring to FIG. 10, pad 54 may comprise copper, aluminum, gold or any other conducting materials. In one embodiment, pad 54 may be formed from an aluminum layer. This aluminum layer may be used as an aluminum cap layer, and the underlying interconnect layers 403 may be formed of copper. Region 404 is a substrate region with active devices, and region 405 is a substrate region without active devices. Vias 400 make an electrical connection from pad 54 to active devices in region 404 of I/O cell 50. Vias 401 make an electrical connection from pad 55 to active devices in region 404 of I/O cell 51. Although examples of specific materials have been mentioned in the context of FIG. 10, alternate embodiments are not limited to the mentioned materials and may use any materials that achieve the desired functionality.

Figure 11:
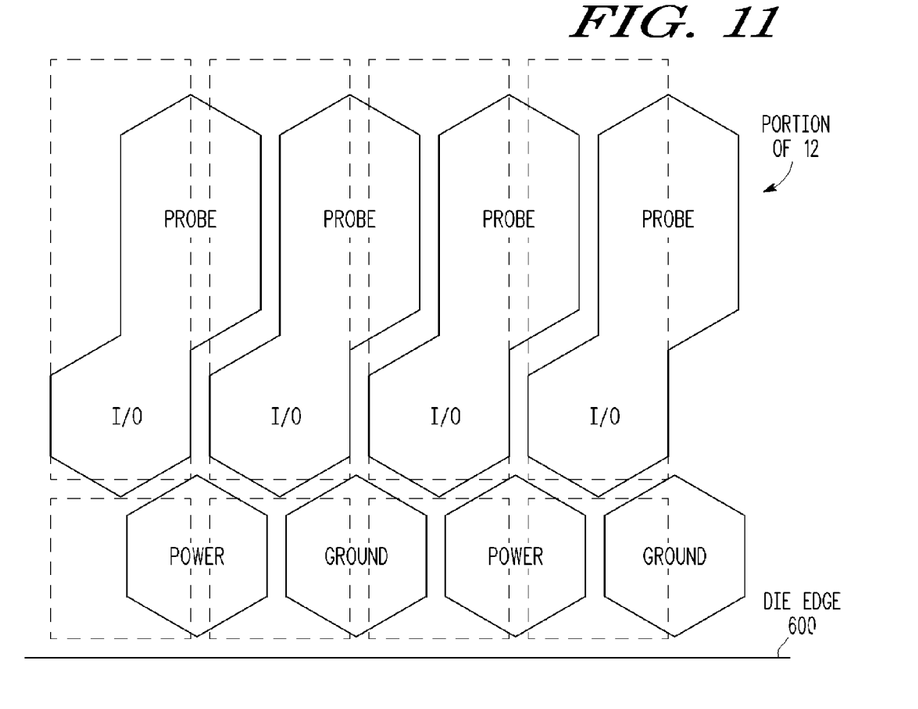
FIGS. 11-14 illustrate a top view of a pad portion of an integrated circuit of FIG. 1 in accordance with alternate embodiments of the present invention.

FIG. 11 illustrates a top view of a pad portion 12 of integrated circuit 10 of FIG. 1 in accordance with an alternate embodiment of the present invention. This embodiment has the constraint that there is less space available in the vertical "y" direction (perpendicular to die edge 600) and more space available in the horizontal "x" direction (parallel to die edge 600). Instead of placing a flat side of a hexagonal shape parallel to the edge of IC 10, it has been found that less space is used in the vertical direction if the flat side of the hexagon shape is placed perpendicular to the edge of IC 10. Note that the dotted lines represent the space that would have been required to accommodate layout of the bond pads using conventional pad technology where the pad for an I/O cell is restricted from overlying a different I/O cell. Note that the layout used in FIG. 11 requires more space in the horizontal "x" direction, but require less space in the vertical "y" direction. This may be an important advantage when the vertical dimension "y" is more limited and constrained than the horizontal dimension "x".

Note that by offsetting the probe pad portion from the bond pad portion (e.g. in the "x" dimension) as illustrated in FIG. 11, it is possible to reduce the vertical space required by the combined probe pad portion and bond pad portion. Note that this physical arrangement allows adjacent pads to be packed more tightly with less wasted space. Alternately, this physical arrangement may be used to make the probe pad portions longer in the "y" direction without requiring an increase in the vertical space required by the combined probe pad portions and bond pad portions.

In alternate embodiments, power bond pads may have associated power probes pads. Similarly, in some embodiments, one or more I/O bond pads may not have associated probe pads. Likewise, in some embodiments, some or all power bond pads and some or all I/O bond pads may have associated probe pads. Alternate embodiments may use different shapes (e.g. square, diamond, rectangular, octagon, circular, oval, curved) which may benefit from the offset of the probe pads from the bond pads, and/or the offset of selected bond pads from each other. Alternate embodiments may use different pad shapes (e.g. octagon, pentagon) that may also benefit from rotating the orientation of the shape relative to the edge 600 of IC 10 in order to allow denser packing of the pads. In addition, combinations of different shapes may be used. Alternate embodiments may use any desired shape, rotation, staggering, or other orientation for bond pads and probe pads.

Figure 12:
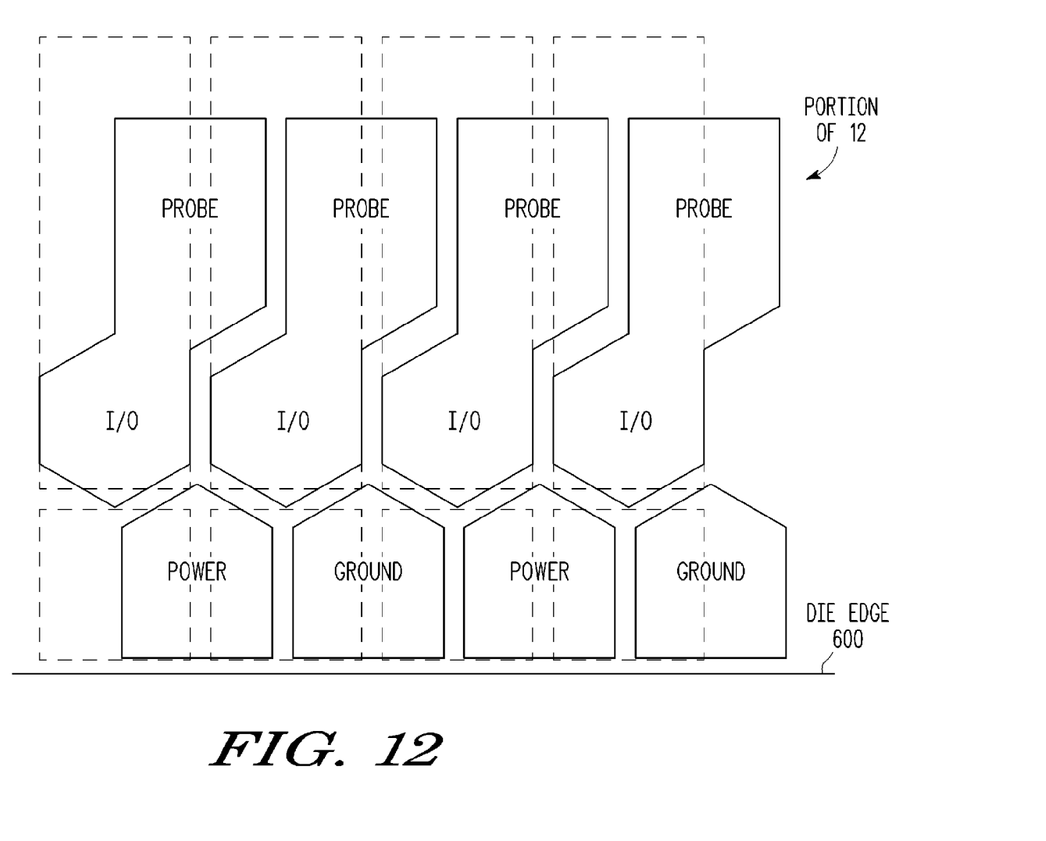

FIG. 12 illustrates a top view of a pad portion 12 of integrated circuit 10 of FIG. 1 in accordance with an alternate embodiment of the present invention. FIG. 12 is very similar to FIG. 11, except the shape of the power bond pads has been changed to a pentagon shape instead of a hexagon shape and the top of the probe pads have been flattened. This allows unused area at the edge of IC 10 to be added to the power bond pads, and unused area at the top of the I/O cells to be added to the probe pads. However, for manufacturability of some embodiments, it may be better not to use pads which have 90 degree angles at the corners of IC 10.

Note that by offsetting the probe pad portion from the bond pad portion, it is possible to reduce the vertical space required by the combined probe pad portion and bond pad portion. Note that this physical arrangement allows adjacent pads to be packed more tightly with less wasted space. Alternately, this physical arrangement may be used to make the probe pad portions longer in the "y" direction without requiring an increase in the vertical space required by the combined probe pad portions and bond pad portions. Alternate embodiments may use any desired shape, rotation, staggering, or other orientation for bond pads and probe pads.

Figure 13:
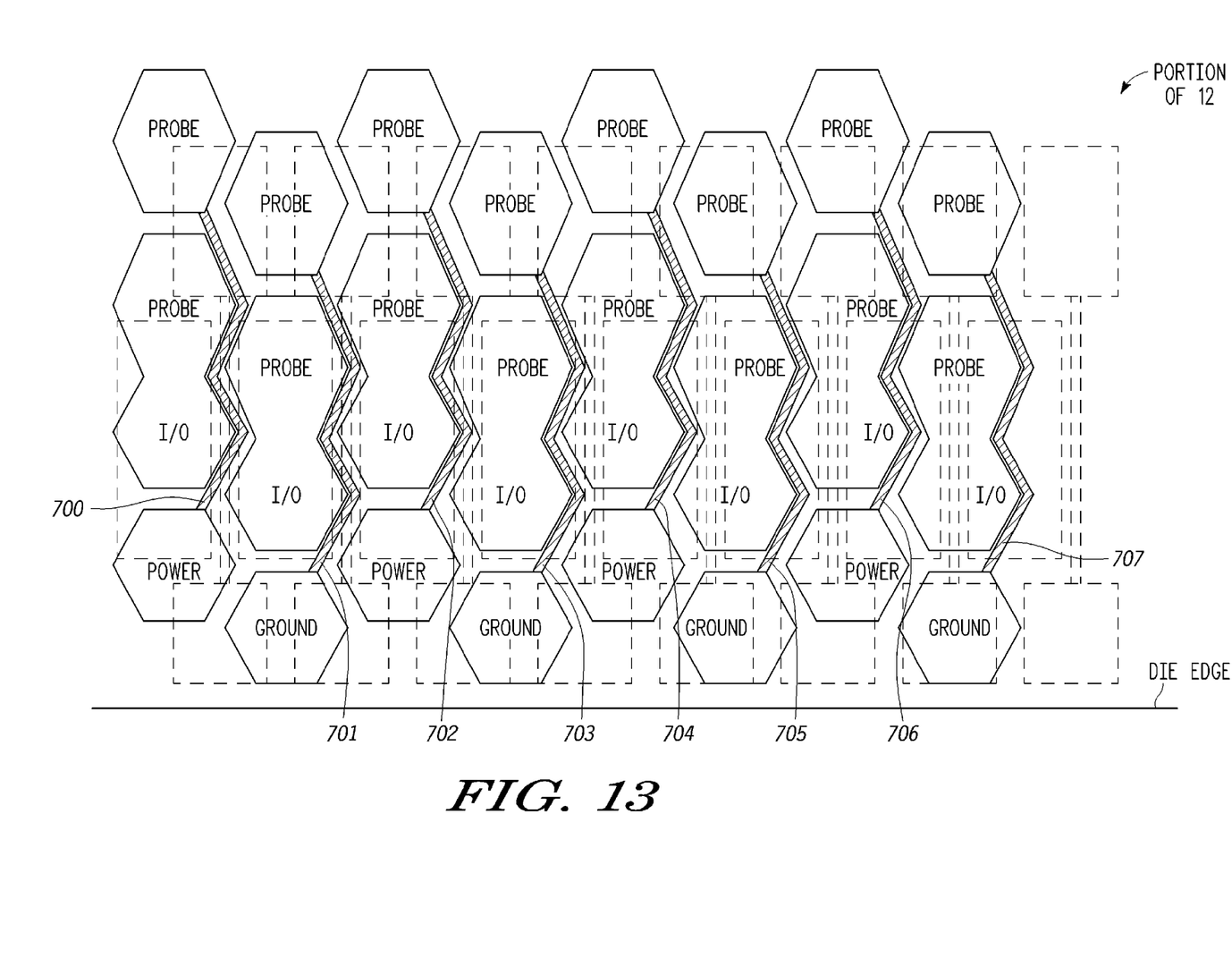

FIG. 13 illustrates a top view of a pad portion 12 of integrated circuit 10 of FIG. 1 in accordance with an alternate embodiment of the present invention. Note that in this embodiment, some of the bond pads and their associated probe pads are electrically connected by way of one or more traces 700-707 because other pads are interposed between the bond pad portion and its associated probe pad portion. Other bond pads and their associated probe pads do not need to use traces for electrical connection because they are contiguous with each other having no other pads interposed between them. One advantage to allowing the use of traces to electrically connect pads is that less space is required in the horizontal "x" direction. Thus space in the "y" direction may be used for the I/O cells instead of space in the "x" direction. Note that for this embodiment, a flat side of a hexagon is placed parallel to the die edge of IC 10. Alternate embodiments may use any desired shape, rotation, staggering, or other orientation for bond pads and probe pads.

Note that the dotted lines in FIG. 13 represent the space that would have been required to accommodate layout of the bond pads using conventional pad technology where the pad for an I/O cell is restricted from overlying a different I/O cell. Note that the layout used in FIG. 13 requires more space in the vertical "y" direction, but require less space in the horizontal "x" direction. This may be an important advantage when the horizontal dimension "x" is more limited and constrained than the vertical dimension "y".

Figure 14:
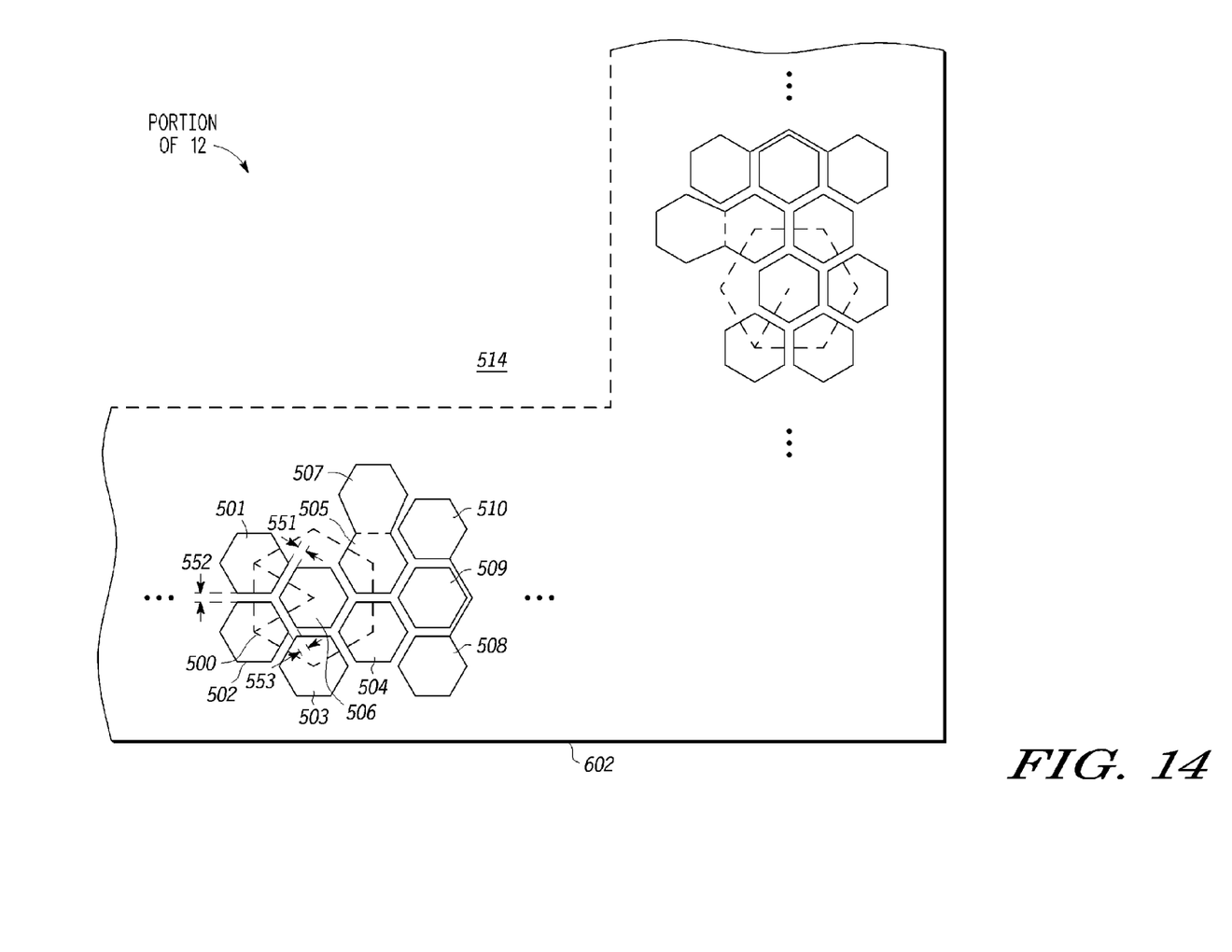

FIG. 14 illustrates a top view of a pad portion 12 of integrated circuit 10 of FIG. 1 in accordance with an alternate embodiment of the present invention. Each of pads 501-510 may be a probe pad and/or a bond pad. Note that the staggered arrangement of pads (bond and/or probe) allows for a denser layout. In one embodiment, pads 501-505 are arranged radially around a center pad 506.

In one embodiment, the minimum distance (labeled "551") between the closest edge of pad 501 and the closest edge of pad 506 is at most 2 micrometers. In addition, the minimum distance (labeled "552") between the closest edge of pad 501 and the closest edge of pad 502 is at most 2 micrometers. In addition, the minimum distance (labeled "553") between the closest edge of pad 502 and the closest edge of pad 506 is at most 2 micrometers.

In an alternate embodiment, the minimum distance (labeled "551") between the closest edge of pad 501 and the closest edge of pad 506 is at most 1 micrometers. In addition, the minimum distance (labeled "552") between the closest edge of pad 501 and the closest edge of pad 502 is at most 1 micrometers. In addition, the minimum distance (labeled "553") between the closest edge of pad 502 and the closest edge of pad 506 is at most 1 micrometers.

Note that pads 501, 502, and 506 are not layed out in a linear arrangement, but instead are staggered in a non-linear manner. In the illustrated embodiment, a hexagonal shape is used, and the centers of pads (e.g. 501-505) also form a hexagonal shape 500 having sides of approximately equal length and having six angles of approximately 120 degrees each. Note that in alternate embodiments, one or more of the pads may not be implemented (e.g. the pad that would be placed directly above 506 in the vertical "y" direction). The denser packing or layout may be advantageous for any number of pad rows, where rows are considered to be arranged in the horizontal "x" direction. In regard to FIG. 14, the "x" direction is the direction parallel to die edge 602 in the plane of the figure, and the "y" direction is the direction perpendicular to die edge 602 in the plane of the figure. In the illustrated embodiment, some of the flat sides of the hexagonal shape 500 formed by the centers of the pads 501-505 are perpendicular to the edge of IC 10. Note that this arrangement of pads allows for an optimal packing of pads for ICs 10 in which there is more space in one direction (e.g. vertical "y") and less space in another direction (e.g. horizontal "x") and also allows for a very dense packing of pads as the layout transitions around corners of IC 10.

Alternate embodiments may locate some of the flat sides of the hexagon shapes (e.g. 500) formed by the centers of the bond pads (e.g. 501-505) parallel to the edge of IC 10. Note that this arrangement of pads allows for an optimal packing of pads for ICs 10 in which there is more space in one direction (e.g. horizontal "x") and less space in another direction (e.g. vertical "y").

Note that the various features of pads and associated I/O cells described in FIGS. 1-10 and throughout this document may be combined in any desired manner and used with the pad layout features illustrated in FIGS. 11-14. Thus, it is intended that any and all of the features described herein may be mixed and matched and interchanged in any desired manner when designing an IC.

In the foregoing specification, the invention has been described with reference to specific embodiments. However, one of ordinary skill in the art appreciates that various modifications and changes can be made without departing from the scope of the present invention as set forth in the claims below. For example, note that bond pads for bump technology do not have to withstand the compressive forces that are applied during wire bonding. Thus, bump technology does not generally have the same strict layout rules for the interconnect underlying the bump pad. Thus, bump pads can be placed anywhere on an IC and are not limited to the periphery.

Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. An integrated circuit die, comprising:
a first bond pad;
a second bond pad;
a third bond pad;
a fourth bond pad;
a first probe region electrically coupled to the fourth bond pad;
a fifth bond pad;
a sixth bond pad;
a seventh bond pad,
wherein the first probe region and all of the first, second, third, fourth, fifth, sixth, and seventh bond pads are arranged according to a hexagonal pattern as viewed from a top down perspective
and wherein the fourth bond pad is a regular hexagon share having sides equal in length and defining equal angles, and wherein the first probe region is a hexagon shape that is not the regular hexagon shape; and
a first I/O cell;
wherein a maximum bond pad width of the fifth bond pad is greater than a maximum I/O cell width of the first I/O cell, wherein the maximum I/O cell width of the first I/O cell and the maximum bond pad width of the fifth bond pad are measured along parallel lines,
wherein the fifth bond pad overlies, as viewed from the top down perspective, a first portion of the first I/O cell, and
wherein the sixth bond pad overlies, as viewed from the top down perspective, a second portion of the first I/O cell.

2. The integrated circuit die of claim 1, further comprising:
a second I/O cell,
wherein the maximum bond pad width of the fifth bond pad is greater than a maximum I/O cell width of the second I/O cell, wherein the maximum I/O cell width of the second I/O cell and the maximum bond pad width of the fifth bond pad are measured along parallel lines.

3. The integrated circuit die of claim 1, wherein the fifth bond pad is electrically coupled to the first I/O cell and the sixth bond pad is not electrically coupled to the first I/O cell.

4. The integrated circuit die of claim 1, further comprising a second probe region adjacent to at least one of the first, second, and third bond pads, wherein the second probe region is hexagonally shaped.

5. The integrated circuit die of claim 2, wherein the second I/O cell comprises active circuitry selected from a group consisting of input circuitry for directly receiving a signal from one of the first bond pad, second bond pad, and third bond pad and output circuitry for directly providing a signal to the one of the first bond pad, second bond pad, and third bond pad.

6. The integrated circuit die of claim 5, wherein at least one of the first bond pad, second bond pad, and third bond pad is connected to the active circuitry of the second I/O cell with a conductive via extending into the integrated circuit die from the at least one of the first bond pad, second bond pad, and third bond pad.

7. The integrated circuit of claim 1, wherein each of the first, second, and third bond pads are regular hexagons having sides substantially equal in length and defining substantially equal angles.

8. An integrated circuit die, comprising:
a plurality of bond pads arranged according to a hexagonal pattern as viewed from a top down perspective, wherein at least five bond pads of the plurality of bond pads form at least part of a hexagon having six corners and six edges, wherein the centers of the at least five bond pads of the plurality of bond pads align with five of the six corners of the hexagon, wherein the hexagon is a regular hexagon having edges equal in length;
an underlying metal layer below the plurality of bond pads; and
a plurality of I/O cells, wherein a first bond pad of the at least five bond pads of the plurality of bond pads is connected to active circuitry of a first I/O cell of the plurality of I/O cells with a via interconnect extending to the underlying metal layer,
wherein a second bond pad of the at least five bond pads overlies at least a portion of the first I/O cell as viewed from the top down perspective, and
wherein the second bond pad is not electrically coupled to the first I/O cell.

9. The integrated circuit die of claim 8, each bond pad of the plurality of bond pads is connected to active circuitry of a corresponding I/O cell of the plurality of I/O cells with a via interconnect extending to the underlying metal.

10. The integrated circuit die of claim 8, wherein a center of at least one bond pad of the plurality of bond pads aligns with a center of the hexagon, and wherein the at least one bond pad of the plurality of bond pads that aligns with the center of the hexagon overlaps no other of the plurality of bond pads.

11. The integrated circuit die of claim 8, wherein the six edges of the hexagon define substantially equal angles.

12. The integrated circuit die of claim 8, wherein at least one bond pad of the plurality of bond pads has a probe region as an extension of the at least one bond pad.

13. The integrated circuit die of claim 8, wherein a maximum bond pad width across each of the plurality of bond pads is greater than a maximum I/O cell width of an I/O cell of the plurality of I/O cells, each maximum bond pad width and the maximum I/O cell width measured along parallel lines.

14. The integrated circuit die of claim 8, wherein a third bond pad of the at least five bond pads is connected with a second via interconnect to circuitry selected from a group consisting of power circuitry and ground circuitry.

15. The integrated circuit die of claim 8, wherein each of the at least five bond pads are regular hexagons having sides substantially equal in length and defining substantially equal angles.

16. A single integrated circuit die, comprising:
a plurality of bond pads arranged according to a regular hexagon pattern, wherein at least five bond pads of the plurality of bond pads form at least part of a first regular hexagon having six corners and six edges, wherein the centers of the at least five bond pads of the plurality of bond pads align with five of the six corners of the first regular hexagon;
core circuitry; and
a die edge of the single integrated die, wherein the at least five bond pads are located between the core circuitry and the die edge of the single integrated circuit die, wherein at least one edge of the six edges of the first regular hexagon is perpendicular to a first portion of the die edge nearest to the at least five bond pads.

17. The integrated circuit die of claim 16, wherein at least five other bond pads of the plurality of bond pads form at least part of a second regular hexagon having six corners and six edges, wherein the centers of the at least five other bond pads of the plurality of bond pads align with five of the six corners of the second regular hexagon, and wherein the at least five other bond pads are located between the core circuitry and the die edge, wherein at least one edge of the six edges of the second regular hexagon is substantially perpendicular to a second portion of the die edge nearest to the at least five other bond pads, the first portion of the die edge being perpendicular to the second portion of the die edge.

18. The integrated circuit die of claim 16, wherein a first bond pad of the at least five bond pads which form at least part of the first regular hexagon is coupled to a second bond pad of the at least five other bond pads which form at least part of the second regular hexagon by way of a trace.

19. The integrated circuit die of claim 16, further comprising:
a plurality of I/O cells, wherein a first bond pad of the plurality of bond pads is connected to active circuitry of a corresponding I/O cell of the plurality of I/O cells, wherein at least a portion of the plurality of bond pads overlies, from a top view perspective, at least a portion of the plurality of I/O cells, and wherein a maximum bond pad width across the first bond pad is greater than a maximum I/O cell width across the corresponding I/O cell of the plurality of I/O cells, the maximum bond pad width and corresponding maximum I/O cell width measured along substantially parallel lines.

20. The integrated circuit die of claim 16, wherein at least one bond pad of the plurality of bond pads has a probe region as an extension of the at least one bond pad.

* * * * *